United States Patent [19]

Davies et al.

[11] Patent Number: 5,032,878
[45] Date of Patent: Jul. 16, 1991

[54] HIGH VOLTAGE PLANAR EDGE TERMINATION USING A PUNCH-THROUGH RETARDING IMPLANT

[75] Inventors: Robert B. Davies, Tempe; Lowell E. Clark, Phoenix; David N. Okada, Tempe, all of Ariz.

[73] Assignee: Motorola, Inc., Schaumburg, Ill.

[21] Appl. No.: 459,506

[22] Filed: Jan. 2, 1990

[51] Int. Cl.⁵ .............................................. H01L 29/90
[52] U.S. Cl. ......................................... 357/13; 357/52; 357/20; 357/58
[58] Field of Search .................... 357/13 U, 65, 43, 19, 357/38, 52, 23.8, 13, 52 D, 36, 20, 58

[56] References Cited

U.S. PATENT DOCUMENTS 4,573,066 2/1986 Whight .................................. 357/52

FOREIGN PATENT DOCUMENTS 0061551 6/1982 European Pat. Off. .......... 357/13 U
54-141596 11/1979 Japan ................................ 357/13 U

OTHER PUBLICATIONS

*Semiconductor Devices, Physics and Technology*, S. M. Sze, Wiley, N.Y. 1981.
*Modern Power Devices*, B. Jayant Baliga, John Wiley & Sons, N.Y., pp. 98–101, 1987.

*Primary Examiner*—William Mintel
*Attorney, Agent, or Firm*—Joe E. Barbee; Stuart T. Langley

[57] ABSTRACT

A high voltage semiconductor structure having multiple guard rings, wherein guard rings farthest from a main junction are spaced further from each other than are guard rings closer to the main junction is provided. An enhancement region, which is of an opposite conductivity type from the guard rings, is formed between the guard rings to increase punch-through voltage between the guard rings, thereby increasing the breakdown voltage of the device. The enhancement region and close guard ring spacing result in a fine gradation of electric field and high punch-through breakdown voltage between guard rings.

11 Claims, 1 Drawing Sheet

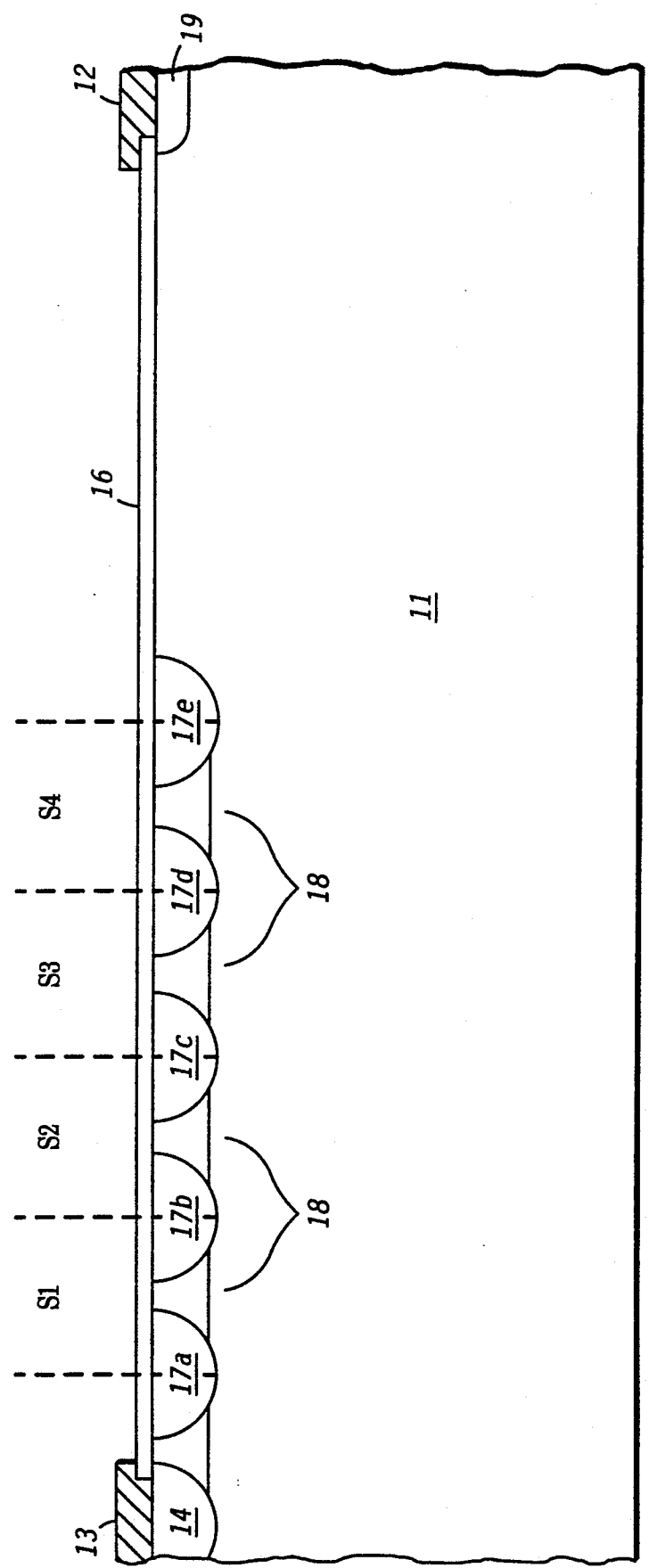

HIGH VOLTAGE PLANAR EDGE TERMINATION USING A PUNCH-THROUGH RETARDING IMPLANT

BACKGROUND OF THE INVENTION

This invention relates, in general, to high voltage semiconductor structures, and more particularly, to high voltage semiconductor structures having a floating guard ring termination that provides for relatively high breakdown voltage.

Breakdown of a planar junction device occurs when an electric field, which develops when the junction is reverse biased, surpasses a critical intensity. The critical intensity is a function of the resistivity of the material in which the junction is fabricated. Depending on device geometry, though, this critical intensity is usually surpassed at terminal voltages well below a maximum theoretical terminal voltage for the device, which is also called a parallel plane junction breakdown voltage. It is well known in the art that a certain amount of voltage is lost due to surface peak electric field between electrodes. This surface peak field results from surface charge and surface states as well as stored charge in overlying layers which distort and condense the electric field at the surface of the device.

This condensed electric field can result in the electric field intensity surpassing the critical intensity at relatively low potential between electrodes of the device. Therefore, it is desirable to have a smooth and evenly distributed electric field between the electrodes. Electric field concentration is commonly near a main junction of the device, and occurs near a surface of a planar structure. It has been found that this problem may be minimized and higher breakdown voltage may be achieved by the implementation of floating guard rings, or field rings surrounding device junctions. Although these guard rings are beneficial for achieving high breakdown voltages, design of such guard rings has been difficult.

Two basic schemes have been used to lay out multiple guard rings terminations for high voltage devices. In the first scheme the field ring spacing and width both decrease with increasing distance from the main junction. This provides a gradual extension of the depletion layer away from the main junction. The field rings further away from the junction could be made narrower because the depletion layer below them becomes progressively shallower. However, this approach did not work well where surface space charge was not precisely known, and did not provide a good technique for determining the actual field ring spacing.

A second scheme uses floating field rings of equal width and spacing but using more rings than the first method. This method produces a much finer gradation in the depletion layer at the edge of the device, while using up slightly more space due to the large number of rings. This design scheme, too, was sensitive to surface charge, although the large number of rings reduced the impact of surface charge variation when compared to the first scheme. Although each of these guard ring schemes resulted in higher breakdown voltages, neither approach resulted in a breakdown voltage which was near the parallel plane junction breakdown.

In a multiple guard ring structure each subsequent ring is at an incrementally higher potential with respect to the main PN junction. For multiple rings to be effective, each successive ring must support the incremental voltage. That is to say, punch-through breakdown voltage from ring-to-ring limits the allowable incremental voltage from ring-to-ring. Although it is desirable to space the rings close together to achieve finer gradation of the electric field, if the rings are close together the punch-through breakdown voltage between rings is low, and subsequent rings are not able to support the full incremental voltage. This situation results in lower breakdown voltage devices.

Alternatively, as the rings are spaced farther from each other to increase punch-through breakdown voltage, the field gradation increases, and more electric field concentration results. The higher field concentration again results in lower breakdown voltage. These two opposing mechanisms have limited practical planar junction devices breakdown voltages less than about 1500 volts. What is needed is a high voltage structure which allows close ring-to-ring spacing but also has high ring-to-ring punch-through breakdown voltage.

Another difficulty with previous multiple guard ring structures was the problem of where to put the first guard ring. A large space between the main PN junction and the first guard ring increased the voltage that a single guard ring could support. This design allowed a single guard ring to support several hundred volts. When more voltage was desired, however, it has been found that this large space establishes a high field concentration in the vicinity of the first ring, and even though this high field was acceptable for a few hundred volts, it kept the structure from achieving higher breakdown voltages. Previous designs merely added more guard rings beyond the first guard ring, without changing the first guard ring spacing. The additional guard rings were effective at lessening field intensity far away from the junction, but did not affect the field intensity which was established by the initial spacing of the first ring. Thus, the additional guard rings improved breakdown voltage somewhat, but breakdown eventually occurred at the first ring where the additional rings could not help.

Accordingly, it is an object of the present invention to provide a high voltage semiconductor structure capable of obtaining relatively high breakdown voltage.

It is another object of the present invention to provide a high voltage semiconductor structure having a relatively simple guard ring design.

A further object of the present invention is to provide a high voltage semiconductor structure which attains a uniform electric field between the electrodes.

Yet another object of the present invention is to provide a high voltage semiconductor structure which reduces the probability of punch-through between guard rings.

SUMMARY OF THE INVENTION

These and other objects and advantages of the present invention are achieved by a high voltage semiconductor structure having multiple guard rings, wherein an enhancement region, which is of an opposite conductivity type from the guard rings, is formed between the guard rings to increase punch-through voltage between the guard rings. Preferably, guard rings farthest from a main junction are spaced further from each other than are guard rings closer to the main junction, thereby increasing the breakdown voltage of the device.

BRIEF DESCRIPTION OF DRAWINGS

The single FIGURE illustrates a highly enlarged cross-sectional view of a portion of a high voltage semiconductor structure embodying the present invention.

DETAILED DESCRIPTION OF DRAWINGS

The FIGURE illustrates a highly enlarged cross-sectional view of a portion of a high voltage semiconductor structure. Additional active circuitry would be formed to the left of the illustrated portion, while a scribe grid would be formed to the right of the illustrated cross-section. It should be understood that although the FIGURE illustrates a multiple guard ring structure, the present invention is applicable to single guard ring structures, although lower breakdown voltages will be achieved. The high voltage semiconductor structure includes a semiconductor layer 11 having a resistivity and thickness chosen to meet a predetermined breakdown voltage. As will be seen, a wide range of resistivities can be used with only slight modification of the present invention. The choice of resistivity and thickness of semiconductor layer 11 to achieve a specified breakdown voltage is well known to those of skill in the art.

Active device region 14 has an opposite conductivity type from semiconductor layer 11 and forms a main PN junction with semiconductor layer 11. Electrode 13 makes electrical contact to active device region 14 and couples active device region 14 with other areas of the semiconductor device which are not shown. Diffused region 19 and electrode 12 are formed adjacent to a sawn or scribed edge of a semiconductor chip and form an edge termination. Diffused region 19 has the same conductivity type as semiconductor layer 11 but is more heavily doped. Thus, since electrode 12 and diffused region 19 are of relatively low resistivity, a constant potential is developed under diffused region 19, which is approximately the same as the potential on the bottom of semiconductor layer 11. This constant potential serves to limit spread of the electric field, also called a depletion region, which forms as the main PN junction is reverse biased. Oxide 16 is merely a passivation oxide formed between electrode 13 and electrode 12 and may comprise oxide, silicon nitride, or other similar insulating materials.

Guard rings 17A-E are formed surrounding the main PN junction at a top surface of semiconductor layer 11. Guard rings 17A-E are of the same conductivity type as active region 14 and thus form auxiliary PN junctions surrounding the main PN junction. The present invention differs from previous termination structures in both spacing of guard rings 17A-E and because of an enhancement region 18, which is formed between guard rings 17A-E.

Spacing from the center of guard ring 17A to the center of guard ring 17B is represented by S1. Likewise, spacings S2-S4 represent center-to-center spacing of respective guard rings which are farther from the main PN junction. Guard rings 17A-E are spaced so that guard rings farthest away from the main junction are further from each other than are guard rings closer to the junction. That is to say, S1, which is the spacing between guard rings 17A and 17B, is smaller than S4, which is the space between guard rings 17D and 17E. Preferably, S1 is less than S2, which is less than S3, which is less than S4. Guard ring 17E can be placed further from 17D because curvature of the depletion region is less farther from the main junction. Guard rings 17A-E are preferably identical in size and shape and are formed during a single diffusion step so they have equal dopant concentration and junction depth. Guard rings 17A-E are preferably in the range of 3.5 to 6.5 microns deep, with 4.5 microns being most useful. Each of guard rings 17A-E differ only in relative spacing to adjacent guard rings.

Preferably, spacing between guard rings 17 increases linearly as each guard ring 17 is added away from the main PN junction. In a preferred embodiment, S1 is 9.5 microns, S2 is 9.75 microns, S3 is 10.0 microns, and for each additional guard ring 17 a 0.25 micron increment is added to the spacing. Any number of guard rings 17 can be added, depending on the desired breakdown voltage. For example, ten guard rings can provide nearly 2,000 volts, while 20-30 guard rings will support over 3,000 volts. The increased spacing between rings should be in the range of 0.2 to 0.3 microns per ring. When the number of rings exceeds 20, it has been found that the increased spacing should be on the order of 0.5 to 0.7 microns for the rings in excess of 20.

Another feature of the high voltage structure of the present invention is enhancement regions 18 formed between each of the guard rings 17A-E, and between first guard ring 17A and active device region 14. Enhancement regions 18 are of the same conductivity type as semiconductor layer 11 and preferably have a surface doping concentration of approximately $4 \times 10^{15}$ atoms/cm$^3$. This doping concentration should be higher than the doping concentration of semiconductor layer 11. Enhancement regions 18 are conveniently formed by ion implantation and diffused so that they are shallower than guard rings 17A-E by about 0.5 microns. The enhancement regions 18 may be confined to an area within the last guard ring 18E. Alternatively, additional guard rings 17 may be used to entirely fill up the area of the die almost to diffused region 19, in which case the enhancement regions 18 may extend out to diffused region 19.

Especially for high voltage devices, where semiconductor layer 11 is very lightly doped, enhancement layer 18 serves to greatly improve the uniformity of guard ring performance. Enhancement regions 18 serve to increase the punch-through voltage between guard rings 17A-E so that the cumulative punch-through voltage approaches the avalanche voltage of the main PN junction. In past guard ring structures, maximum breakdown voltage was limited not by the avalanche voltage of the main PN junction, but instead by the punch-through breakdown voltage from ring-to-ring. With the use of enhancement layer 18, however, the sum of the ring-to-ring breakdown voltage approaches the main PN junction avalanche voltage, so that a higher voltage may be applied to the main PN junction before breakdown.

Enhancement regions 18 allow for a great variation in the resistivity of semiconductor layer 11 without changing design of guard rings 17A-E. This allows for an active device to be formed in a variety of substrates, one substrate being designed for a 500 volt operation, while another may be designed for a 2000 volt operation, without altering the masks which form the device. This offers a great cost savings and added flexibility for manufacturers. Not only can a wide variety of substrates be used, but enhancement regions 18 greatly improve immunity to surface charge and surface states also.

A third major feature of the invention is the relatively close spacing between the guard rings and the main PN junction. When multiple guard rings are used, first guard ring 17A is preferably placed less than 15 microns from active device region 14. This relatively close spacing between active region 14 and first guard ring 17A establishes a low curvature for the depletion region during reverse bias so that at high voltages the electric field does not surpass the critical field for semiconductor material 11. While this close spacing does not fully utilize first guard ring 17A to capture as much voltage as it possibly could, the added benefit achieved at higher voltages are significant. By controlling field curvature and field density near first guard ring 17A, as opposed to controlling curvature only near the last guard ring 17E, high breakdown voltages may be achieved.

By now it should be apparent that a high voltage semiconductor structure has been provided. The high voltage structure of the present invention allows for uniform design of a wide variety of high voltage devices, and allows planar devices to achieve breakdown voltages which are as close as desired to parallel plane breakdown voltages. An enhancement region formed between each of a plurality of equal sized rings allows the high voltage structure to be used with a variety of material resistivities. Spacing of each of the plurality of guard rings allows controlled contouring of field lines of a depletion region formed between a main junction and a semiconductor layer in which the guard rings are formed.

We claim:

1. A high voltage semiconductor structure comprising: a semiconductor substrate; a main PN junction formed in the semiconductor substrate; a guard ring of a first conductivity type formed in the semiconductor substrate and surrounding the main PN junction; and an enhancement region of a second conductivity type formed in the semiconductor substrate between the main PN junction and the guard ring, wherein the enhancement region is doped more heavily than the semiconductor substrate.

2. A high voltage semiconductor structure comprising: a semiconductor substrate; a main PN junction formed in the semiconductor substrate; a guard ring of a first conductivity type formed in the semiconductor substrate and surrounding the main PN junction; and an enhancement region of a second conductivity type formed in the semiconductor substrate between the main PN junction and the guard ring, wherein the enhancement region is doped more heavily than the semiconductor substrate and the main PN junction and the guard ring are deeper than the enhancement region.

3. A high voltage semiconductor structure comprising: a semiconductor substrate; a main PN junction formed in the semiconductor substrate; a guard ring of a first conductivity type formed in the semiconductor substrate and surrounding the main PN junction; and an enhancement region of a second conductivity type formed in the semiconductor substrate between the main PN junction and the guard ring, wherein the enhancement region is doped more heavily than the semiconductor substrate and the enhancement region does not extend away from the main PN junction beyond the guard ring.

4. A high voltage semiconductor structure comprising: a semiconductor body of a first conductivity type and having a top surface and having a background doping concentration; a first region of a second conductivity type formed in the body and adjoining the top surface and forming a main PN junction with the semiconductor body; a plurality of guard rings of the second conductivity type surrounding the main PN junction and adjoining the top surface; and a plurality of enhancement regions of the first conductivity type adjoining the top surface and located between each of the plurality of guard rings and between one of the guard rings and the main PN junction, wherein the enhancement regions have a higher doping concentration than the background doping concentration.

5. The semiconductor structure of claim 4 wherein a distance between the main PN junction and a guard ring which is nearest the main PN junction is less than 15 microns.

6. The semiconductor structure of claim 4 wherein all of the guard rings are the same size.

7. A high voltage semiconductor structure comprising: a semiconductor body of a first conductivity type and having a top surface and having a background doping concentration; a first region of a second conductivity type formed in the body and adjoining the top surface and forming a main PN junction with the semiconductor body; a plurality of guard rings of the second conductivity type surrounding the main PN junction and adjoining the top surface; and a plurality of enhancement regions of the first conductivity type adjoining the top surface and located between each of the plurality of guard rings and between one of the guard rings and the main PN junction, wherein the enhancement regions have a higher doping concentration than the background doping concentration, wherein the enhancement regions are shallower than the guard rings.

8. The semiconductor structure of claim 4 wherein center-to-center spacing of guard rings nearer the main PN junction is less than center-to-center spacing of guard rings which are farther from the main PN junction.

9. A high voltage semiconductor structure comprising: a semiconductor substrate of a first conductivity type having a first surface, wherein the substrate has a bulk doping concentration; a main PN junction formed in the semiconductor substrate; a plurality of guard rings of a second conductivity type formed in the semiconductor substrate surrounding the main junction; and regions of increased surface doping with respect to the bulk doping concentration formed near the first surface in an area between the guard rings, wherein center-to-center spacing between adjacent rings increases with increasing distance from the main PN junction.

10. The semiconductor structure of claim 9 wherein the increase in center-to-center spacing between adjacent rings is in the range of 0.2 to 0.7 microns per additional ring.

11. The semiconductor structure of claim 9 further comprising a region of increased surface doping with respect to the bulk doping concentration formed near the first surface and extending beyond the guard rings away from the main PN junction.

* * * * *